(12) United States Patent
Sugai et al.

(10) Patent No.: US 12,362,254 B2
(45) Date of Patent: Jul. 15, 2025

(54) ELECTRONIC COMPONENT MOUNTING BASE AND ELECTRONIC DEVICE

(71) Applicant: KYOCERA Corporation, Kyoto (JP)

(72) Inventors: Kouichirou Sugai, Kyoto (JP); Kazuki Nishimoto, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 396 days.

(21) Appl. No.: 17/762,429

(22) PCT Filed: Sep. 25, 2020

(86) PCT No.: PCT/JP2020/036298
§ 371 (c)(1),
(2) Date: Mar. 22, 2022

(87) PCT Pub. No.: WO2021/060475
PCT Pub. Date: Apr. 1, 2021

(65) Prior Publication Data
US 2022/0336316 A1    Oct. 20, 2022

(30) Foreign Application Priority Data

Sep. 25, 2019 (JP) ................................. 2019-174322

(51) Int. Cl.
*H01L 23/367* (2006.01)
*H01L 23/373* (2006.01)

(52) U.S. Cl.
CPC ........ *H01L 23/367* (2013.01); *H01L 23/3735* (2013.01)

(58) Field of Classification Search
CPC ... H01L 23/367; H01L 23/3735; H01L 33/62; H01L 33/64; H05K 2201/10106; H05K 1/021
See application file for complete search history.

(56) References Cited

FOREIGN PATENT DOCUMENTS

| JP | 10189845 A | * | 7/1998 |
| JP | 2000150718 A | * | 5/2000 |
| WO | 2017/188237 A1 | | 11/2017 |

* cited by examiner

*Primary Examiner* — James Wu
(74) *Attorney, Agent, or Firm* — Volpe Koenig

(57) ABSTRACT

An electronic component mounting substrate includes: a metal base including a first surface and a recessed portion having a frame-like shape, the recessed portion opening to the first surface and including a bottom surface, an inner side surface, and an outer side surface; and an insulation base plate bonded via a bonding material to a position surrounded by the recessed portion on the first surface. A protective layer is provided on the inner side surface of the recessed portion, and on the bottom surface, the protective layer extending from the inner side surface to the outer side surface is not provided.

14 Claims, 11 Drawing Sheets

ELECTRONIC COMPONENT MOUNTING BASE AND ELECTRONIC DEVICE

TECHNICAL FIELD

The present disclosure relates to an electronic component mounting substrate and an electronic device.

BACKGROUND ART

In recent years, electronic devices such as LEDs used in automobile headlamps and the like have been required to have high heat dissipating properties. A metal substrate, for example, is used in a first electronic device (see, for example, WO 2017/188237).

SUMMARY OF INVENTION

An electronic component mounting substrate according to the present disclosure includes: a metal base including a first surface and a recessed portion having a frame-like shape, the recessed portion opening to the first surface and including a bottom surface, an inner side surface, and an outer side surface; and an insulation base plate bonded to a position surrounded by the recessed portion on the first surface via a bonding material. A protective layer is provided on the inner side surface of the recessed portion, and on the bottom surface, the protective layer extending from the inner side surface to the outer side surface is not provided.

An electronic device of the present disclosure includes the above-described electronic component mounting substrate and an electronic component mounted on the electronic component mounting substrate.

DESCRIPTION OF EMBODIMENTS

Figure 1A:
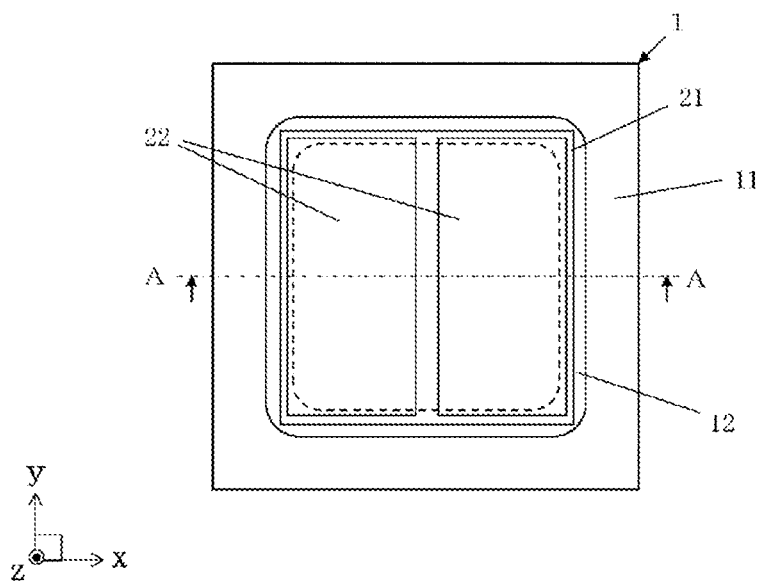
FIG. 1A is a top view illustrating an electronic component mounting substrate according to a first embodiment.
Figure 1B:
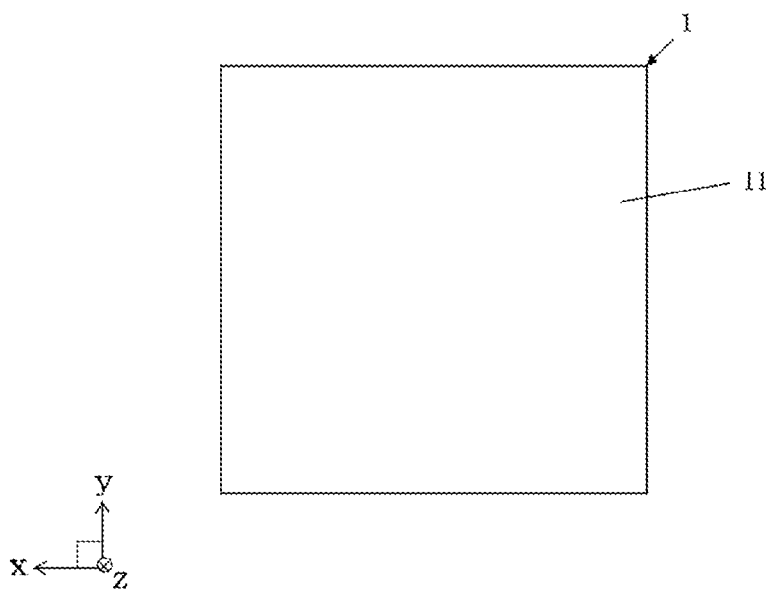
FIG. 1B is a bottom view of FIG. 1A.

Several exemplary embodiments of the present disclosure will be described with reference to the accompanying drawings.

First Embodiment

An electronic component mounting substrate 1 according to the present embodiment includes: a metal base 11 including a first surface and a recessed portion 12 having a frame-like shape, the recessed portion opening to the first surface and including a bottom surface 12a, an inner side surface, and an outer side surface; and an insulation base plate 21 joined to a position surrounded by the recessed portion 12 on the first surface via a bonding material 31. The insulation base plate 21 includes a wiring layer 22 on a first surface and a joint layer 23 on a second surface. A protective layer 13 is provided on the inner side surface of the recessed portion 12. On the bottom surface 12a, the protective layer 13 extending from the inner side surface to the outer side surface is not provided. In FIGS. 1A to 4B, an upward direction is defined as a positive direction along a virtual z axis. Note that the terms "top" and "bottom" are used in the following description by way of convenience and should not be construed as limitations in the actual use of the electronic component mounting substrate 1 or the like.

The metal base 11 includes the first surface (top surface in FIGS. 1A to 4B), the second surface (bottom surface in FIGS. 1A to 4B) on a side opposite to the first surface in a thickness direction, and side surfaces. A material having high thermal conductivity, for example, a metal material such as copper (Cu), copper-tungsten (Cu—W), or aluminum (Al) can be used for the metal base 11. In a configuration in which the electronic component mounting substrate 1 is applied to an automobile headlight or the like, aluminum is suitable as a material for the metal base 11 due to being light-weight.

The metal base 11 includes the recessed portion 12 having a frame-like shape. The recessed portion opens to the first surface and includes the bottom surface 12a, the inner side surface, and the outer side surface. The recessed portion 12 is positioned surrounding a mounting portion 11a to which the insulation base plate 21 is bonded. The recessed portion 12 is formed by cutting, laser machining, or the like the first surface of the metal base 11.

The insulation base plate 21 includes a first surface (top surface in FIGS. 1A to 4B), a second surface (bottom surface in FIGS. 1A to 4B) on a side opposite to the first surface in a thickness direction, and side surfaces. The insulation base plate 21 includes a single insulation layer or a plurality of insulation layers, and has a rectangular shape when viewed in plan view, that is, when viewed from a direction perpendicular to the first surface. The insulation base plate 21 functions as a support body for supporting the electronic component 2. The insulation base plate 21 includes, when viewed in plan view, the wiring layer 22 for mounting the electronic component 2 on a first surface side, and the joint layer 23 for bonding the insulation base plate 21 to the metal base 11 on a second surface side.

The insulation base plate 21 may be made from a ceramic, such as an aluminum oxide-based sintered body (alumina ceramic), an aluminum nitride-based sintered body, a silicon nitride-based sintered body, a mullite-based sintered body, or a glass ceramic sintered body. In a configuration in which the insulation base plate 21 is, for example, an aluminum nitride-based sintered body, a slurry is produced by adding a suitable organic binder, a solvent, and the like to a raw material powder of aluminum nitride (AlN), erbium oxide (Er2O3), yttrium oxide (Y2O3), or the like, and then mixing them. A ceramic green sheet is produced by forming the slurry described above into a sheet using a known doctor blade method, calender roll method, or the like. If necessary, a plurality of ceramic green sheets are stacked and fired at a high temperature (approximately 1800° C.) to produce the insulation base plate 21 formed of a single insulation layer or a plurality of insulation layers.

The wiring layer 22 is located on the first surface of the insulation base plate 21. The wiring layer 22 is used as a connecting portion of a connecting member 3 such as a bonding wire, and is used for electrically connecting the electronic component 2 and a connection pad of a module substrate.

The joint layer 23 is located on the second surface of the insulation base plate 21. The joint layer 23 is used as a bonding portion such as a bonding material 31, and is used for bonding the metal base 11 and the insulation base plate 21 to each other.

The wiring layer 22 and the joint layer 23 include a thin film layer and a plating layer. The thin film layer includes, for example, a contact metal layer and a barrier layer. The contact metal layer constituting the thin film layer is formed on the first surface or the second surface of the insulation base plate 21. The contact metal layer is made from, for example, tantalum nitride, nickel-chromium, nickel-chromium-silicon, tungsten-silicon, molybdenum-silicon, tungsten, molybdenum, titanium, or chromium, and is deposited on the first surface or the second surface of the insulation base plate 21 by adopting a thin film formation technique such as vapor deposition, ion plating, or sputtering. For example, in the case of forming the contact metal layer using a vacuum vapor deposition method, the insulation base plate 21 is placed in a deposition chamber of a vacuum deposition apparatus, and a metal piece to serve as the contact metal layer is disposed on the deposition source in the deposition chamber. Thereafter, the deposition chamber is brought into a vacuum state (pressure of $10^{-2}$ Pa or less), and the metal piece disposed on the deposition source is heated and vaporized so that molecules of the vaporized metal piece are deposited on the insulation base plate 21, thereby forming a layer of thin film metal that serves as the contact metal layer. Then, after forming a resist pattern, using a photolithography method, on the insulation base plate 21 on which the layer of thin film metal is formed, an excess part of the layer of thin film metal is removed by etching to form the contact metal layer. The barrier layer is deposited on a top surface of the contact metal layer. The barrier layer has good joining properties and wettability with the contact metal layer and the plating layer, strongly bonds the contact metal layer and the plating layer, and prevents mutual diffusion between the contact metal layer and the plating layer. The barrier layer is made from, for example, nickel-chromium, platinum, palladium, nickel, or cobalt, and is deposited on a surface of the contact metal layer by a thin film formation technique such as vapor deposition, ion plating, or sputtering.

Preferably, the thickness of the contact metal layer is approximately from 0.01 to 0.5 µm. A thickness of less than 0.01 µm tends to prevent the contact metal layer from strongly adhering on the metal base 11. A thickness of more than 0.5 µm tends to cause the contact metal layer to more easily peel off due to internal stress produced in the formation of the contact metal layer. Preferably, the thickness of the barrier layer is approximately from 0.05 to 1 µm. When the thickness is less than 0.05 µm, a flaw such as a pinhole is more likely to occur and the barrier layer is less likely to function properly. A thickness of more than 1 µm tends to cause the barrier layer to more easily peel off due to internal stress produced in the formation of the barrier layer.

The plating layer is deposited by an electroplating method or an electroless plating method on a surface where the thin film layer is exposed. The plating layer is made from a metal, such as nickel, copper, gold, or silver, that has superior corrosion resistance and superior joining properties with the connecting member 3. For example, a nickel plating layer having a thickness of approximately from 0.5 to 5 µm and a gold plating layer having a thickness of approximately from 0.1 to 3 µm are deposited in that order. This can effectively suppress corrosion of the wiring layer 22 and the joint layer 23 and strengthen bonding between the wiring layer 22 and the connecting member 3 and bonding between the joint layer 23 and the metal base 11.

Furthermore, a metal layer such as copper (Cu) or gold (Au) may be disposed on the barrier layer so that the plating layer is favorably formed. The metal layer described above is formed by the same method as the thin film layer.

The protective layer 13 is provided on the inner side surface of the recessed portion 12. However, on the bottom surface 12a, the protective layer 13 extending from the inner side surface to the outer side surface is not provided. In a configuration in which the metal base 11 is made of, for example, aluminum, the protective layer 13 is formed from, for example, aluminum oxide. The protective layer 13 is formed to have a thickness of approximately 0.1 nm to 10 nm. The protective layer 13 is not located on the first surface surrounded by the recessed portion 12, that is, the mounting portion 11a to which the insulation base plate 21 is bonded. Note that the protective layer 13 may be partly located on the bottom surface 12a of the recessed portion 12, or may not be located at all on the bottom surface 12a of the recessed portion 12.

For example, in a configuration in which the metal base 11 is made of aluminum and the protective layer 13 is made of aluminum oxide, the protective layer 13 made of aluminum oxide is formed by oxidizing the first surface or the recessed portion 12 of the metal base 11. It is only required that, thereafter, the protective layer 13 formed on the mounting portion 11a of the metal base 11 and on the bottom surface 12a of the recessed portion 12 be removed. For example, after forming the recessed portion 12 in the surface of the metal base 11, the inner surface of the recessed portion 12 is oxidized to form the protective layer 13 made of aluminum oxide, and the bonding material 31 such as solder is placed, for example, on the mounting portion 11a and in the recessed portion 12. Furthermore, energy such as ultrasonic waves may be imparted to the mounting portion 11a and the bottom surface 12a of the recessed portion 12 to remove the protective layer 13 removed from the mounting portion 11a and the base surface 12a of the recessed portion 12. The bonding material 31, such as solder, placed on the mounting portion 11a and the bottom surface 12a of the recessed portion 12 may be placed individually to remove the protective layer 13, and then the bonding material 31 may be added so that the bonding material 31 on the mounting portion 11a and the bonding material 31 in the recessed portion 12 are bonded.

An electronic device can be produced by mounting the electronic component 2 on the first surface of the insulation base plate 21 of the electronic component mounting substrate 1. The electronic component 2 mounted on the electronic component mounting substrate 1 may be a semiconductor element such as an IC chip or an LSI chip, an imaging element such as a charge coupled device (CCD) or a complementary metal oxide semiconductor (CMOS), a light-emitting element such as a laser diode (LD) or a light-emitting diode (LED), or a light-receiving element such as a photo diode (PD). For example, in a configuration in which the electronic component 2 is a wire-bonding semiconductor element, the semiconductor element is fixed on the insulation base plate 21 by the connecting member such as a low-melting point brazing material or a conductive resin, and then mounted on the electronic component mounting substrate 1 by electrically connecting the electrodes of the semiconductor element and the wiring layer 22 via the bonding member 3 such as a bonding wire. As described above, the electronic component 2 is electrically connected to the wiring layer 22.

For example, in a configuration in which the electronic component 2 is a flip-chip-type electronic component 2, the electronic component is mounted on the electronic component mounting substrate 1 by electrically and mechanically connecting electrodes of the electronic component 2 and the wiring layer 22 via the connecting member 3 such as a solder bump, a gold bump, or a conductive resin (e. g., anisotropic conductive resin).

In addition, a plurality of the electronic components 2 may be mounted on the first surface of the insulation base plate 21. Where necessary, a small electronic component such as a resistance element or a capacitive element may be mounted in a periphery of the electronic component 2. Furthermore, where necessary, the electronic component 2 may be sealed with a sealing material made from a resin, glass, or the like, or with a lid made from a resin, glass, ceramic, metal, or the like. Note that, as in the example illustrated in FIG. 5, a heat dissipation body 4 such as a heat sink may be attached to the electronic device.

The electronic component mounting substrate according to the present embodiment includes: the metal base 11 including the first surface and the recessed portion 12 having a frame-like shape, the recessed portion opening to the first surface and including the bottom surface 12a, the inner side surface, and the outer side surface; and the insulation base plate 21 connected via the bonding material 31 to a position surrounded by the recessed portion 12 on the first surface. A protective layer 13 is provided on the inner side surface of the recessed portion 12, and on the bottom surface 12a, the protective layer 13 extending from the inner side surface to the outer side surface is not provided. In a configuration in which the metal base 11 and the insulation base plate 21 are bonded via the bonding material 31 according to the configuration described above, the bottom surface 12a and the first surface of the recessed portion 12 are displaced in a thickness direction of the electronic component mounting substrate 1, resulting in a discontinuous recessed portion 12 divided between the bottom surface 12a and the first surface. Furthermore, stress in a planar direction generated due to a difference in thermal expansion or the like can be divided and dispersed between the bottom surface 12a and the first surface of the recessed portion 12, and the bonding strength between the metal base 11 and the insulation base plate 21 can be favorable. Thus, the electronic component mounting substrate 1 can be favorably used over a long period of time.

Furthermore, the protective layer 13 may be provided on an outer side surface of the recessed portion 12, so that the bonding material 31 cannot easily crawl on the first surface of the metal base 11, the first surface being located on an outer side of the recessed portion 12.

In a configuration in which, in a plane perspective, the electronic component 2 and other components that are mounted on the first surface of the insulation base plate 21 are located further inward than the inner side surface of the recessed portion 12, heat of the electronic component 2 or the other components can be dissipated to the metal base 11 side via the insulation base plate 21. Thus, the electronic component mounting substrate 1 can have excellent reliability over a long period of time.

A configuration in which a light-emitting element is used as the electronic component 2 can be adopted such that the electronic component mounting substrate 1 for mounting a light emitting element has high brightness and a compact size and can be used over a long period of time.

Note that in a configuration in which the protective layer 13 is provided over an entire periphery of the inner side surface of the recessed portion 12 of the metal base 11, stress in the planar direction due to a difference in thermal expansion or the like is divided and dispersed over the entire periphery between the bottom surface 12a and the first surface of the discontinuous recessed portion 12, and the bonding strength between the metal base 11 and the insulation base plate 21 can be favorable.

In addition, in a configuration in which the protective layer 13 is not provided over an entire periphery of the bottom surface 12a of the recessed portion 12 having a frame-like shape, the bonding material 31 favorably bonds over the entire periphery of the bottom surface 12a of the recessed portion 12 having the frame-like shape, and the stress is divided and dispersed between the bottom surface 12a and the first surface of the discontinuous recessed portion 12, and the bonding strength between the metal base 11 and the insulation base plate 21 can be favorable.

Additionally, in a configuration in which an outer edge of the insulation base plate 21 in plan view overlaps with the bottom surface 12a of the recessed portion 12 in a plane perspective, stress is dispersed in the recessed portion 12 located at the outer edge of the insulation base plate 21 (mounting portion 11a), and bonding strength can be improved.

In addition, in a configuration in which the outer edge of the insulation base plate 21 in plan view overlaps with the bottom surface 12a of the recessed portion 12 over the entire periphery in a plane perspective, stress is dispersed in the recessed portion 12 located at the outer edge of the insulation base plate 21 (mounting portion 11a), and bonding strength can be further improved.

Figure 2A:
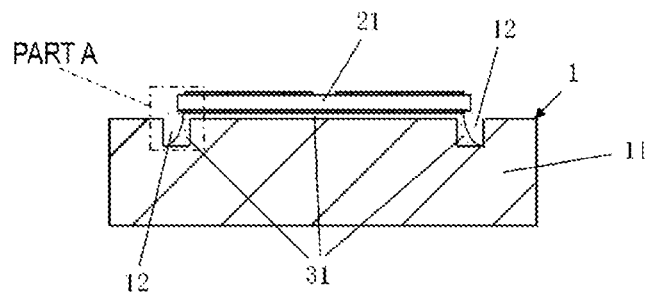
FIG. 2A is a vertical cross-sectional view taken along line A-A of the electronic component mounting substrate illustrated in FIG. 1A.
Figure 2B:
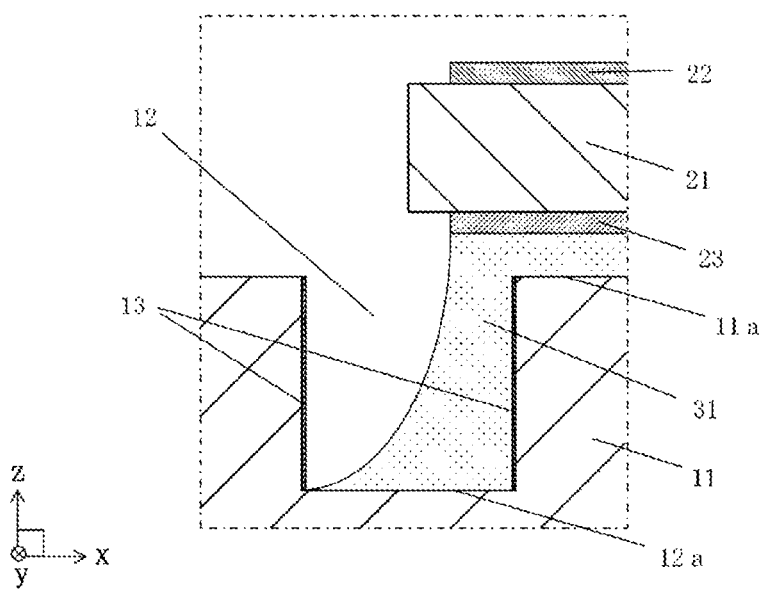
FIG. 2B is an enlarged vertical cross-sectional view of a main portion in a part A in FIG. 2A.
Figure 3A:
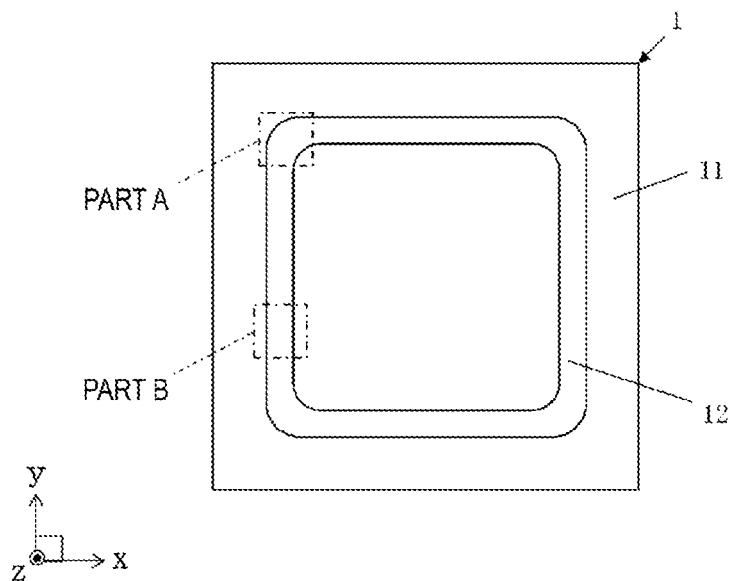
FIG. 3A is a top view illustrating a metal base of the electronic component mounting substrate in FIG. 1.
Figure 3B:
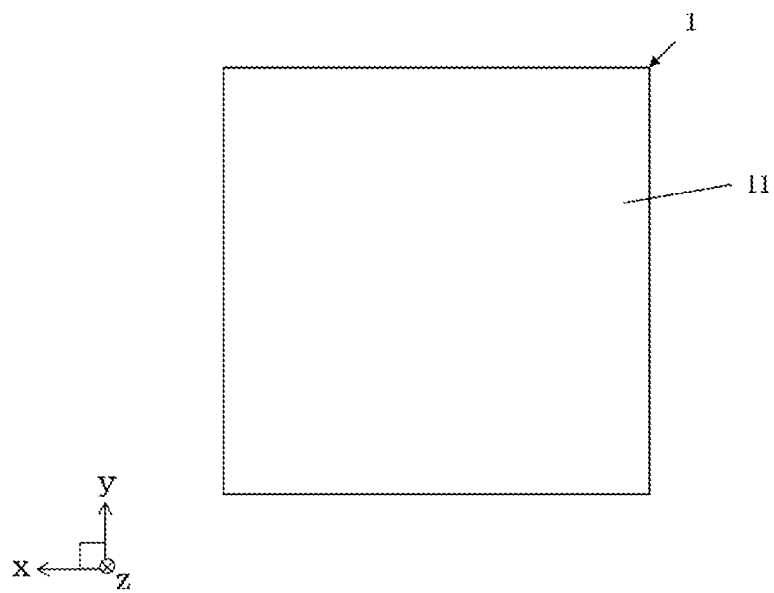
FIG. 3B is a bottom view of FIG. 3A.
Figure 4A:
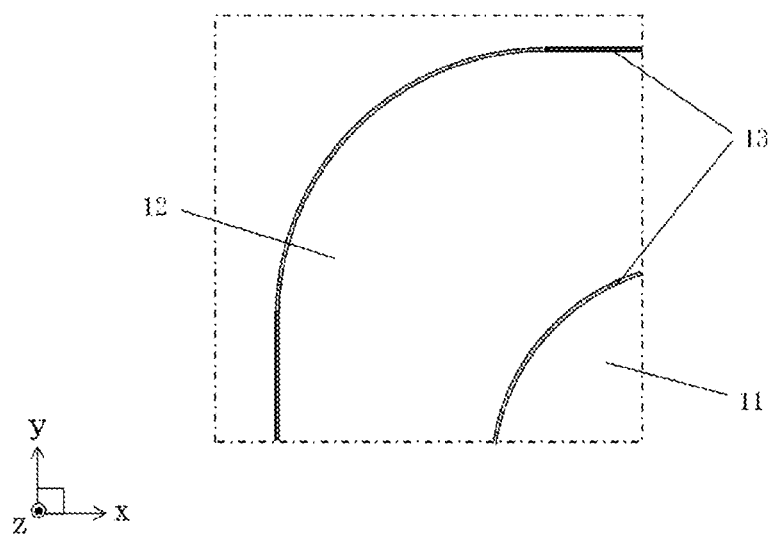
FIG. 4A is an enlarged top view of a main portion in a part A of FIG. 3A.
Figure 4B:
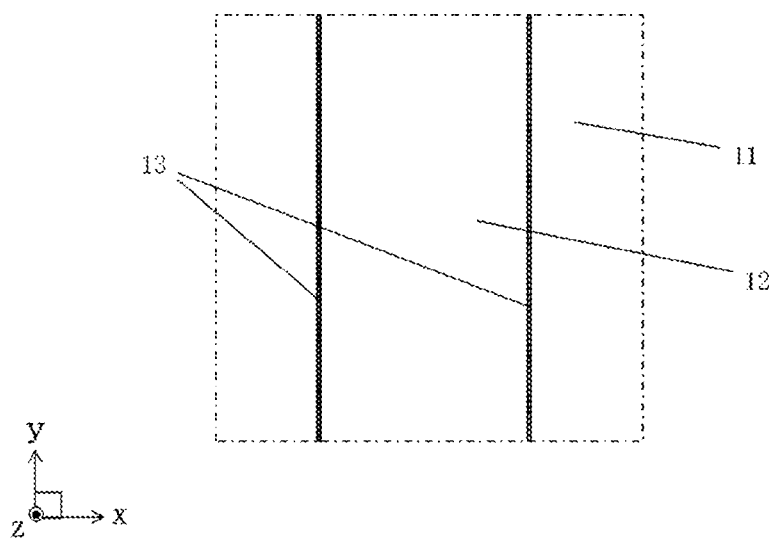
FIG. 4B is an enlarged top view of a main portion of a part B of FIG. 3A.

Note that in a configuration in which the protective layer 13 is located on the outer side surface of the recessed portion 12, as in the example illustrated in FIGS. 2A and 2B, the bonding material 31 is less likely to crawl on the outer side surface side of the insulation base plate 21, and the bonding strength between the metal base 11 and the insulation base plate 21 can be improved. Thus, the electronic component mounting substrate 1 can be favorably used over a long period of time.

The electronic device of the present embodiment includes the electronic component mounting substrate 1 having the configuration described above and the electronic component 2 mounted on the electronic component mounting substrate 1. Thus, the electronic device can be favorably used over a long period of time.

The wiring layer 22 of the electronic device is electrically connected to a wiring conductor of an external device.

Figure 5:
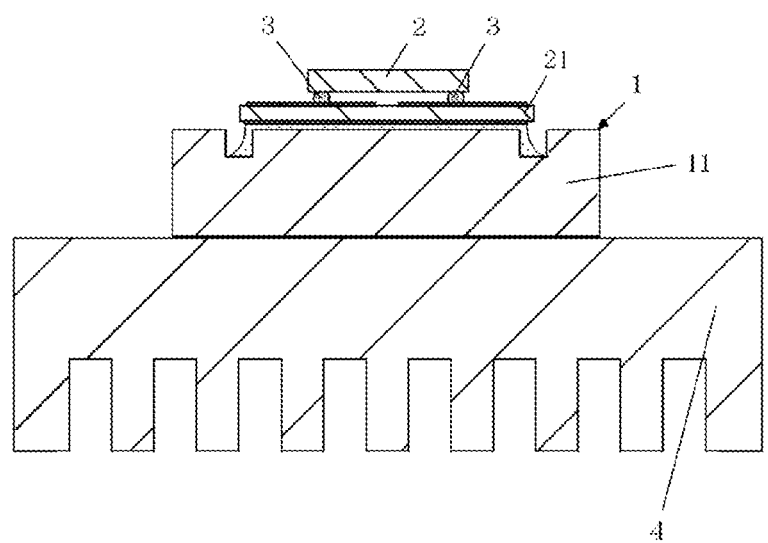
FIG. 5 is a vertical cross-sectional view illustrating an electronic device including an electronic component mounted on the electronic component mounting substrate and a heat dissipation body.
Figure 6A:
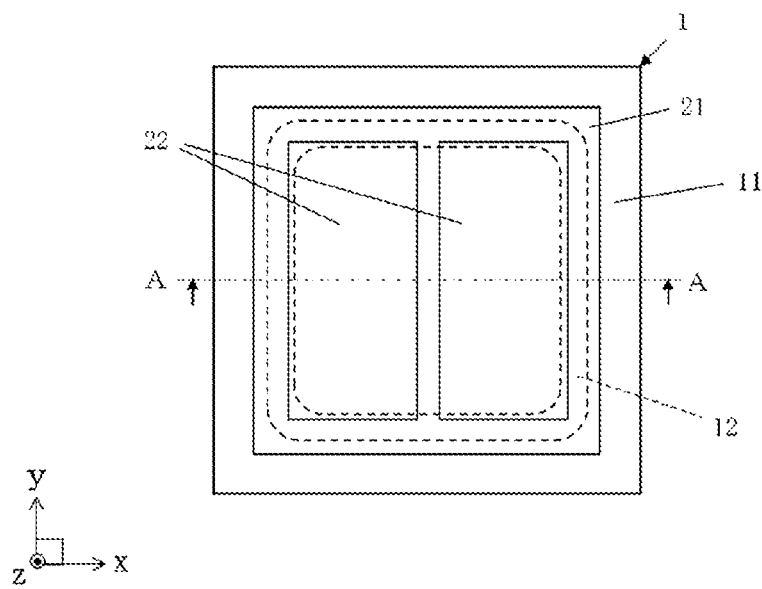
FIG. 6A is a top view illustrating an electronic component mounting substrate according to a second embodiment.
Figure 6B:
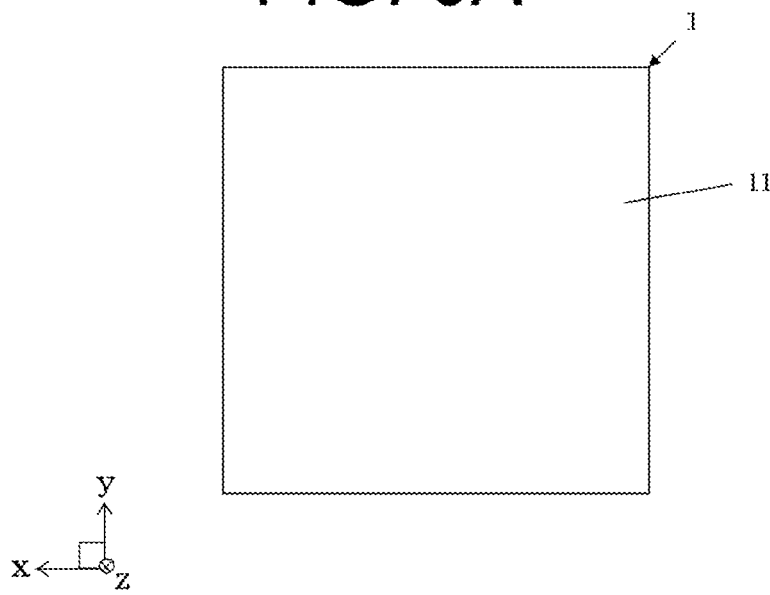
FIG. 6B is a bottom view of FIG. 6A.
Figure 7A:
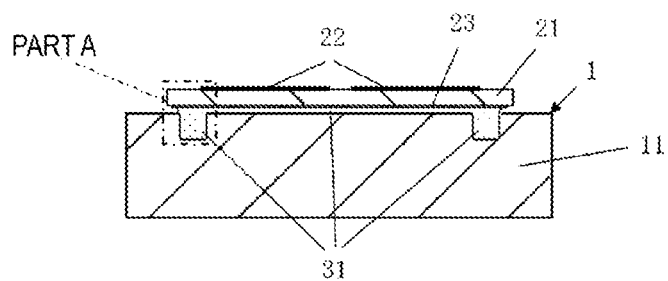
FIG. 7A is a vertical cross-sectional view of the component mounting substrate illustrated in FIG. 6A taken along line A-A.
Figure 7B:
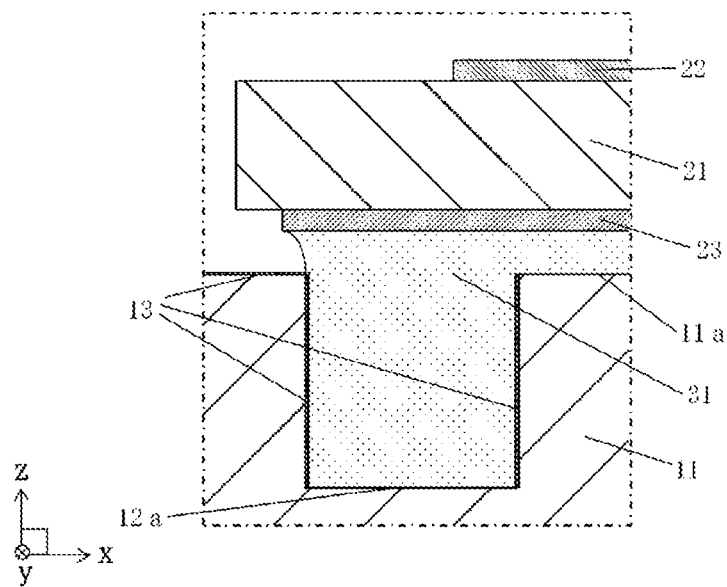
FIG. 7B is an enlarged vertical cross-sectional view of a main portion in a part A in FIG. 7A.
Figure 8A:
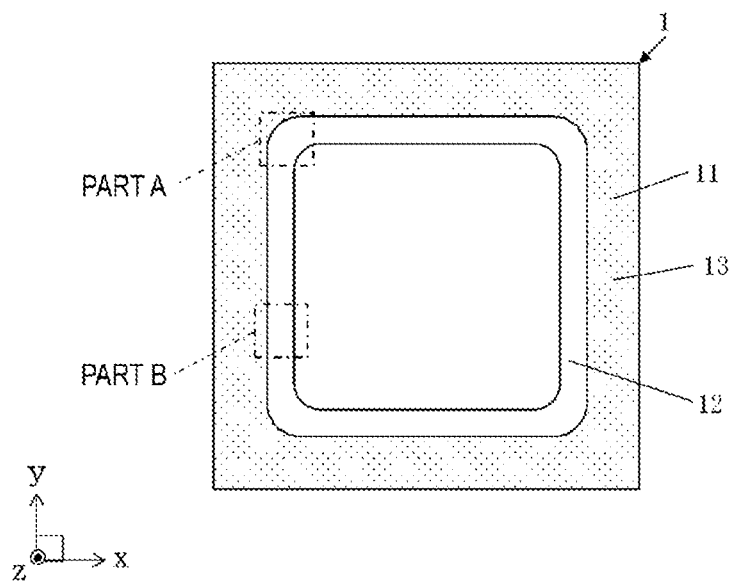
FIG. 8A is a top view illustrating a metal base of the electronic component mounting substrate in FIG. 6.
Figure 8B:
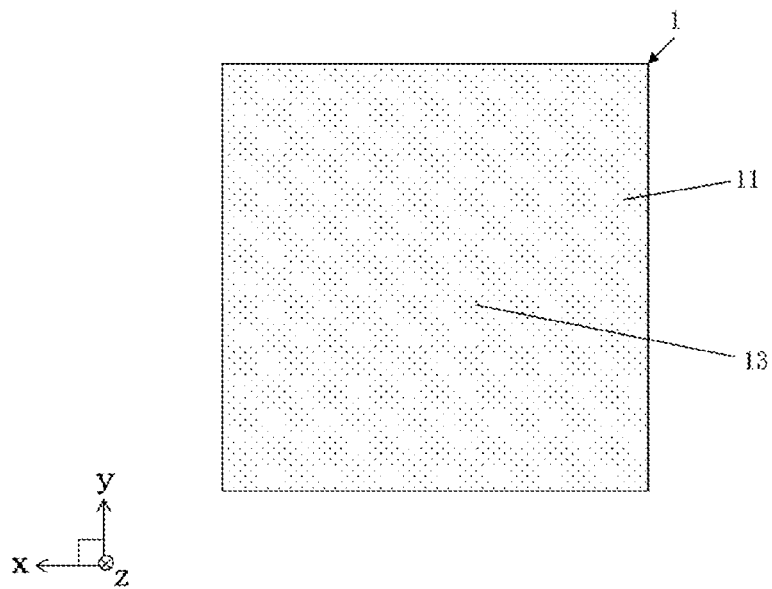
FIG. 8B is a bottom view of FIG. 8A.
Figure 9A:
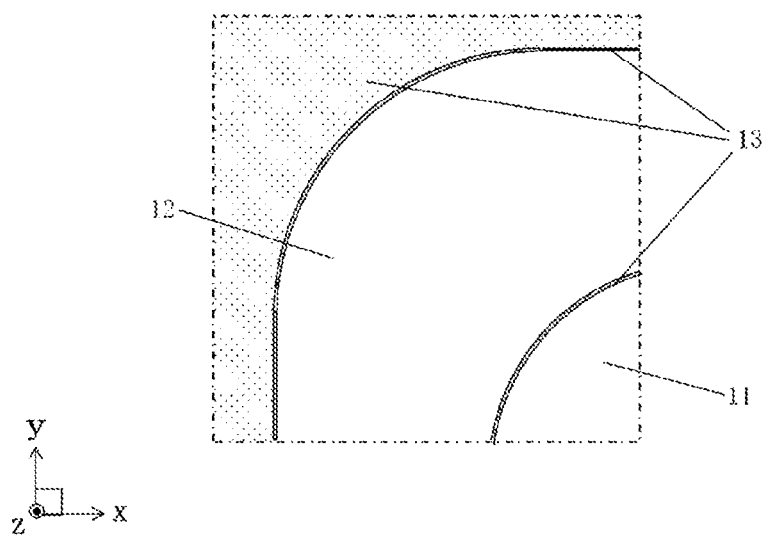
FIG. 9A is an enlarged top view of a main portion in a part A of FIG. 8A.
Figure 9B:
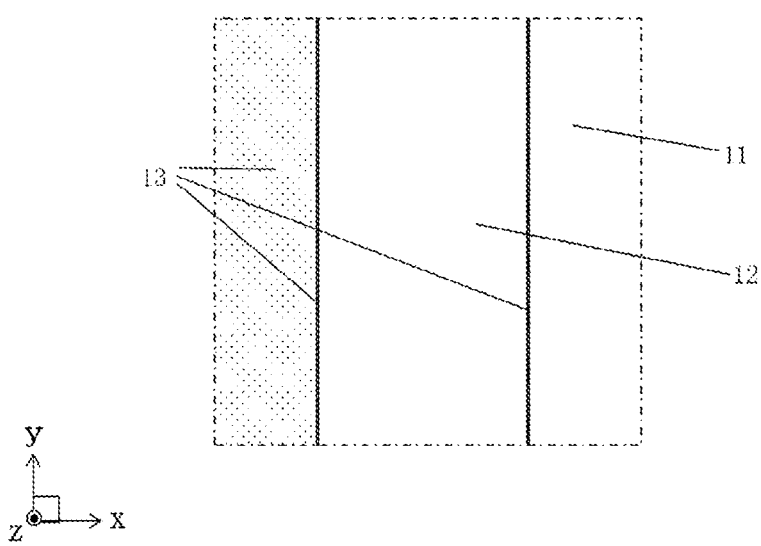
FIG. 9B is an enlarged top view of a main portion in a part B of FIG. 8A.

Furthermore, as in the example illustrated in FIG. 5, when the heat dissipation body 4 made of Al or the like is bonded to a bottom surface of the electronic device, heat of the electronic device can be favorably dissipated by the heat dissipation body 4, and the electronic device can be favorably used over a long period of time.

The heat dissipation body 4 is, for example, provided with a through hole on an outer side of the bonding portion between the electronic device and the heat dissipation body 4 in plan view, the electronic device is held by the external device by screwing through the through hole, and the wiring layer 22 of the electronic device and a wiring conductor of the external device are electrically connected by a connecting material.

Second Embodiment

An electronic component mounting substrate 1 according to a second embodiment will be described next with reference to FIGS. 6A to 9B.

The electronic component mounting substrate 1 according to the second embodiment differs from the electronic component mounting substrate 1 according to the embodiment described above in that the outer edge of the insulation base plate 21 is located on an outer side of the recessed portion 12 in plan view.

The protective layer 13 located on the first surface of the metal base 11 is illustrated by shading in the examples illustrated in FIGS. 8A, 8B, 9A, and 9B.

In the electronic component mounting substrate 1 according to the second embodiment, similar to the electronic component mounting substrate 1 of the embodiment described above, when the metal base 11 and the insulation base plate 21 are bonded via the bonding material 31, the bottom surface 12a and the first surface of the recessed portion 12 are displaced in the thickness direction of the electronic component mounting substrate 1, resulting in a discontinuous recessed portion 12 divided between the bottom surface 12a and the first surface. Furthermore, stress in the planar direction due to a difference in thermal expansion or the like can be divided and dispersed between the bottom surface 12a and the first surface of the recessed portion 12, and the bonding strength between the metal base 11 and the insulation base plate 21 can be favorable. Thus, the electronic component mounting substrate 1 can be favorably used over a long period of time.

Furthermore, in a configuration in which the outer edge of the insulation base plate 21 in plan view is located on the outer side of the recessed portion 12, stress in the planar direction due to a difference in thermal expansion or the like can be dispersed in the recessed portion 12 located on an outer edge side of the insulation base plate 21, the outer edge side being the starting point of cracking, peeling, or the like, and the bonding strength between the metal base 11 and the insulation base plate 21 can be improved.

Note that in a configuration in which the protective layer 13 is located on the outer side surface of the recessed portion 12 and on the outer side of the recessed portion 12 on the first surface of the metal base 11, the bonding material 31 is less likely to crawl on a side surface or top surface of the insulation base plate 21, and the bonding strength between the metal base 11 and the insulation base plate 21 can be improved. Thus, the electronic component mounting substrate 1 can be favorably used over a long period of time.

Figure 10:
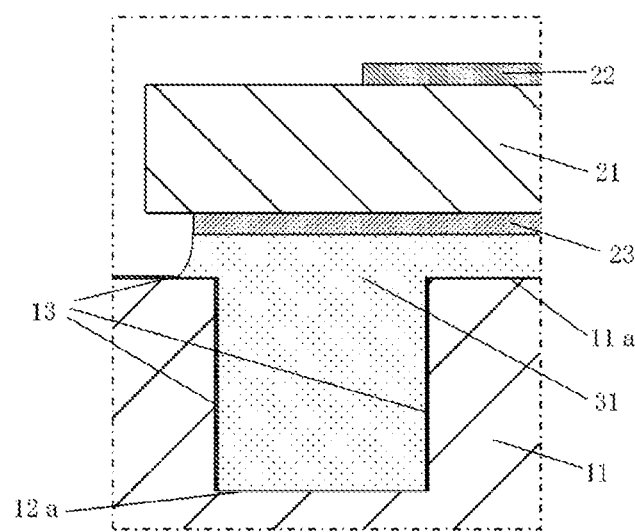
FIG. 10 is an enlarged vertical cross-sectional view of a main portion illustrating another example of an electronic component mounting substrate according to a second embodiment.

In addition, as in the example illustrated in FIG. 10, in a configuration in which the protective layer 13 is provided only on the outer side of the recessed portion 12 on the first surface of the metal base 11, away from the recessed portion 12, stress in the planar direction due to a difference in thermal expansion or the like can be divided and dispersed between the bottom surface 12a and the first surface of a discontinuous recessed portion 12, and bonding strength can be improved. Furthermore, in such a configuration, the bonding material 31 is less likely to spread on the first surface, and thus the electronic component mounting substrate 1 can be used more favorably over a long period of time.

A configuration in which a light-emitting element is used as the electronic component 2 can be used to obtain the electronic component mounting substrate 1 for mounting a light emitting element that has high brightness and a compact size and can be used over a long period of time.

The electronic component mounting substrate 1 of the second embodiment can be manufactured using the same manufacturing method as that of the electronic component mounting substrate 1 of the embodiment described above.

Third Embodiment

Figure 11A:
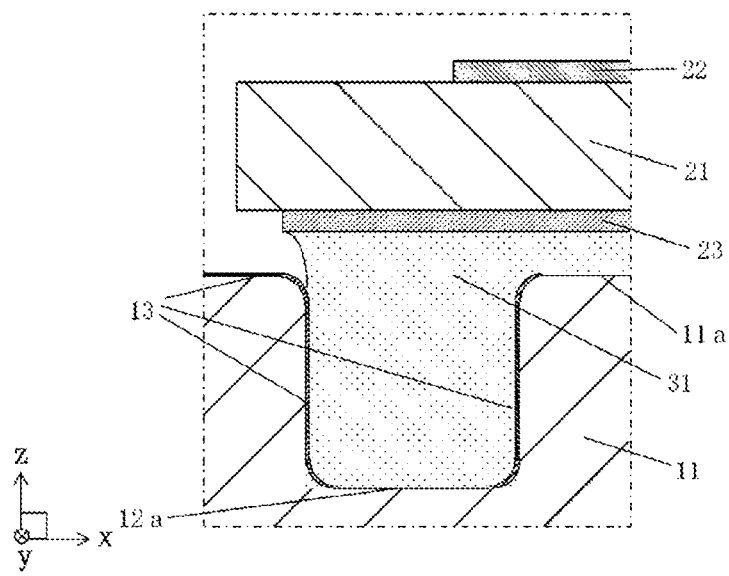
FIG. 11A is an enlarged vertical cross-sectional view of a main portion illustrating an example of an electronic component mounting substrate according to a third embodiment.
Figure 11B:
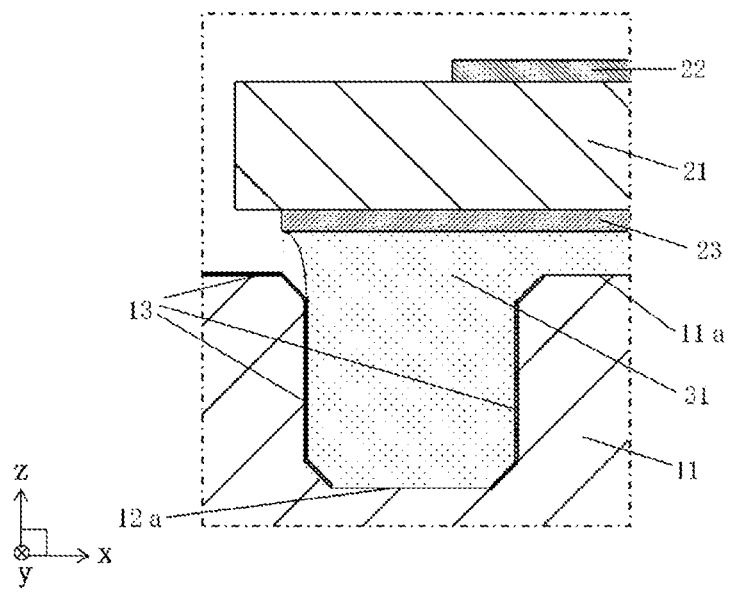
FIG. 11B is an enlarged vertical cross-sectional view of a main portion illustrating another example of the electronic component mounting substrate according to the third embodiment.

An electronic element mounting substrate 1 according to a third embodiment will be described next with reference to FIGS. 11A and 11B.

The electronic component mounting substrate 1 according to the third embodiment differs from the electronic component mounting substrates 1 of the embodiments described above in that the opening of the recessed portion 12 has a convex arc shape or a chamfer shape in a vertical cross-sectional view.

In the electronic component mounting substrate 1 according to the third embodiment, the metal base 11 and the insulation base plate 21 can be bonded via the bonding material 31, similar to the electronic component mounting substrate 1 of the embodiments described above, and the bottom surface 12a and the first surface of the recessed portion 12 can be displaced in the thickness direction of the electronic component mounting substrate 1, resulting in a discontinuous recessed portion 12 divided between the bottom surface 12a and the first surface. Furthermore, stress in the planar direction due to a difference in thermal expansion or the like can be divided and dispersed between the bottom surface 12a and the first surface of the discontinuous recessed portion 12, and the bonding strength between the metal base 11 and the insulation base plate 21 can be favorable. Thus, the electronic component mounting substrate 1 can be favorably used over a long period of time.

In addition, in a configuration in which an opening of the recessed portion 12 has a convex arc shape or a chamfer shape in a vertical cross-sectional view, stress in the planar direction due to a difference in thermal expansion or the like can be dispersed by the convex arc shape or chamfer shape, in the vertical cross-sectional view, of the opening forming a corner portion of the recessed portion 12, instead of being transmitted to the bonding material 31, and the bonding strength between the metal base 11 and the insulation base plate 21 can be favorable. Note that the protective layer 13 may be located in the opening of the recessed portion 12 having the convex arc shape or chamfer shape in the vertical cross-sectional view. Furthermore, corner portions formed by the inner and outer side surfaces and the bottom surface 12a of the recessed portion 12 may have the convex arc shape or chamfer shape in a vertical cross-sectional view, and the protective layer 13 may be located in the corner portion formed by the inner and outer side surfaces and the bottom surface 12a of the recessed portion 12, the corner portion having the convex arc shape or chamfer shape in a vertical cross-sectional view.

A configuration in which a light-emitting element is used as the electronic component 2 can be used to obtain the electronic component mounting substrate 1 for mounting a light emitting element that has high brightness and a compact size and can be used over a long period of time.

The electronic component mounting substrate 1 according to the third embodiment can be manufactured using the same manufacturing method as that of the electronic component mounting substrates 1 of the other embodiments described above.

The present invention is not limited to the above-described embodiments, and various modifications are applicable. For example, the insulation base plate 21 may have a rectangular shape with a cut out portion or chamfer in a side surface or corner portion in plan view.

Furthermore, for example, the outer edge of the insulation base plate 21 may be located in a region overlapping with the recessed portion 12 in a plane perspective and further outward than the recessed portion 12 in a plane perspective.

Furthermore, in the electronic component mounting substrate 1, a plurality of the recessed portions 12 each having a frame-like shape may be formed in the metal base 11, and the insulation base plate 21 may be disposed in each of the recessed portions 12 having the frame-like shape. The plurality of insulation base plates 21 may be insulation base plates 21 each having an outer edge that overlaps with the recessed portion 12 in a plane perspective or insulation base plates 21 that are each located further outward than the recessed portion 12 in a plane perspective, or may be both. Furthermore, the electronic device may include one or a plurality of the electronic components 2 on each of the insulation base plates 21.

REFERENCE SIGNS LIST

1 Electronic component mounting substrate
11 Metal base
12 Recessed portion
12a Bottom surface
13 Protective layer
21 Insulation base plate
22 Wiring layer
23 Joint layer
31 Bonding material
2 Electronic component
3 Connecting member
4 Heat dissipation body

The invention claimed is:
1. An electronic component mounting substrate, comprising:
 a metal base comprising a first surface and a recessed portion, the recessed portion opening to the first surface and comprising a bottom surface, an inner side surface, and an outer side surface;
 a bonding material; and
 an insulation base plate bonded to the metal base in a region including the recessed portion and the first surface via the bonding material,
 wherein a protective layer is provided on the inner side surface of the recessed portion,
 wherein the insulation base plate has a rectangular shape in a plan view, wherein in the plan view, the recessed portion is provided at a position overlapping with the insulation base plate, and has a frame-like shape extending along an outer edge of the insulation base plate; wherein
 the protective layer is not provided on an entire periphery of the bottom surface of the recessed portion of the metal base;
 the bonding material is directly bonded to the metal base at the bottom surface of the recessed portion of the metal base without the protective layer between the bonding material and the bottom surface; and
 the protective layer is provided over an entire periphery of the inner side surface of the recessed portion of the metal base.

2. The electronic component mounting substrate according to claim 1, wherein an outer edge of the insulation base plate in a plan view overlaps with the bottom surface of the recessed portion in a plane perspective.

3. The electronic component mounting substrate according to claim 2, wherein the protective layer has a first portion located on the outer side surface of the recessed portion and a second portion located on the first surface; and
 the second portion is located in a region extending from the outer side surface to an outer edge of the first surface.

4. An electronic device, comprising:
 the electronic component mounting substrate according to claim 3; and
 an electronic component mounted on the electronic component mounting substrate.

5. An electronic device, comprising:
 the electronic component mounting substrate according to claim 2; and
 an electronic component mounted on the electronic component mounting substrate.

6. The electronic component mounting substrate according to claim 1, wherein the outer edge of the insulation base plate in a plan view is located on the outer side surface of the recessed portion.

7. The electronic component mounting substrate according to claim 6, wherein the protective layer has a first portion located on the outer side surface of the recessed portion and a second portion located on the first surface; and
 the second portion is located in a region extending from the outer side surface to an outer edge of the first surface.

8. An electronic device, comprising:
 the electronic component mounting substrate according to claim 7; and
 an electronic component mounted on the electronic component mounting substrate.

9. An electronic device, comprising:
 the electronic component mounting substrate according to claim 6; and an electronic component mounted on the electronic component mounting substrate.

10. The electronic component mounting substrate according to claim 1, wherein the protective layer has a first portion located on the outer side surface of the recessed portion and a second portion located on the first surface; and
the second portion is located in a region extending from the outer side surface to an outer edge of the first surface.

11. An electronic device, comprising:
the electronic component mounting substrate according to claim 10; and
an electronic component mounted on the electronic component mounting substrate.

12. An electronic device, comprising:
the electronic component mounting substrate according to claim 10; and
an electronic component mounted on the electronic component mounting substrate.

13. An electronic device, comprising:
the electronic component mounting substrate according to claim 1; and
an electronic component mounted on the electronic component mounting substrate.

14. The electronic mounting substrate according to claim 1, wherein both of the inner side surface and the outer side surface extend substantially in parallel to a side surface of the insulation base plate.

* * * * *